US012779890B2

(12) United States Patent
Nojima et al.

(10) Patent No.: US 12,779,890 B2
(45) Date of Patent: Nov. 3, 2026

(54) PATTERNING METHOD OF QUANTUM DOTS, METHOD FOR PRODUCING OPTICAL DEVICE, METHOD FOR MANUFACTURING BACKLIGHT UNIT, AND METHOD FOR MANUFACTURING IMAGE DISPLAY DEVICE

(71) Applicant: SHIN-ETSU CHEMICAL CO., LTD., Tokyo (JP)

(72) Inventors: Yoshihiro Nojima, Annaka (JP); Kazuya Tobishima, Annaka (JP); Shinji Aoki, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 250 days.

(21) Appl. No.: 18/708,653

(22) PCT Filed: Oct. 24, 2022

(86) PCT No.: PCT/JP2022/039576
§ 371 (c)(1),
(2) Date: May 9, 2024

(87) PCT Pub. No.: WO2023/090065
PCT Pub. Date: May 25, 2023

(65) Prior Publication Data

US 2025/0001786 A1 Jan. 2, 2025

(30) Foreign Application Priority Data

Nov. 18, 2021 (JP) ................................ 2021-187456

(51) Int. Cl.
*B41M 3/00* (2006.01)
*H10H 20/01* (2025.01)
*H10W 90/00* (2026.01)

(52) U.S. Cl.
CPC ............ *B41M 3/003* (2013.01); *H10H 20/01* (2025.01); *H10W 90/00* (2026.01); *H10H 20/0361* (2025.01)

(58) Field of Classification Search
CPC ............................... B41M 3/003; H10H 20/01
See application file for complete search history.

(56) References Cited

U.S. PATENT DOCUMENTS

2003/0127659 A1 7/2003 Bawendi et al.
2009/0201462 A1* 8/2009 Gruber .................. G02C 7/104 351/159.65

(Continued)

FOREIGN PATENT DOCUMENTS

JP 2002-510866 A 4/2002
JP 2005-260135 A 9/2005

(Continued)

OTHER PUBLICATIONS

Dec. 27, 2022, International Search Report issued in International Patent Application No. PCT/JP2022/039576.

(Continued)

*Primary Examiner* — Steven M Page
(74) *Attorney, Agent, or Firm* — Oliff PLC

(57) ABSTRACT

A patterning method of quantum dots, the method includes the steps of coating with a mixture containing quantum dots and a curable resin on a substrate to obtain a resin layer, ejecting a curing agent in a pattern shape on the resin layer by an inkjet method, performing a curing treatment to cure the portion of the resin layer where the curing agent was ejected, and removing an uncured portion of the resin layer with a solvent.

17 Claims, 1 Drawing Sheet

(56) References Cited

U.S. PATENT DOCUMENTS

| | | | | |
|---|---|---|---|---|
| 2012/0113672 | A1 | 5/2012 | Dubrow et al. | |
| 2017/0133534 | A1* | 5/2017 | Ko | H10F 77/315 |
| 2018/0024277 | A1 | 1/2018 | Murata et al. | |
| 2020/0161517 | A1 | 5/2020 | Lee | |
| 2020/0225388 | A1* | 7/2020 | Jiang | H05B 33/145 |

FOREIGN PATENT DOCUMENTS

| | | | | | |
|---|---|---|---|---|---|
| JP | 2008183486 | A | | 8/2008 | |
| JP | 2013-544018 | A | | 12/2013 | |
| JP | 2016157114 | A | * | 9/2016 | G03F 7/029 |
| JP | 2017-021322 | A | | 1/2017 | |
| JP | 2020-516015 | A | | 5/2020 | |
| JP | 2021-012383 | A | | 2/2021 | |
| KR | 2017-0134479 | A | | 12/2017 | |
| WO | 2018/225782 | A1 | | 12/2018 | |

OTHER PUBLICATIONS

May 2, 2024, International Preliminary Report on Patentability issued in International Patent Application No. PCT/JP2022/039576.

Aug. 6, 2024 Office Action issued in Japanese Patent Application No. 2021-187456.

Nov. 12, 2024 Office Action issued in Japanese Patent Application No. 2021-187456.

Jul. 1, 2026 Office Action issued in Korean Patent Application No. 10-2024-7015631.

* cited by examiner

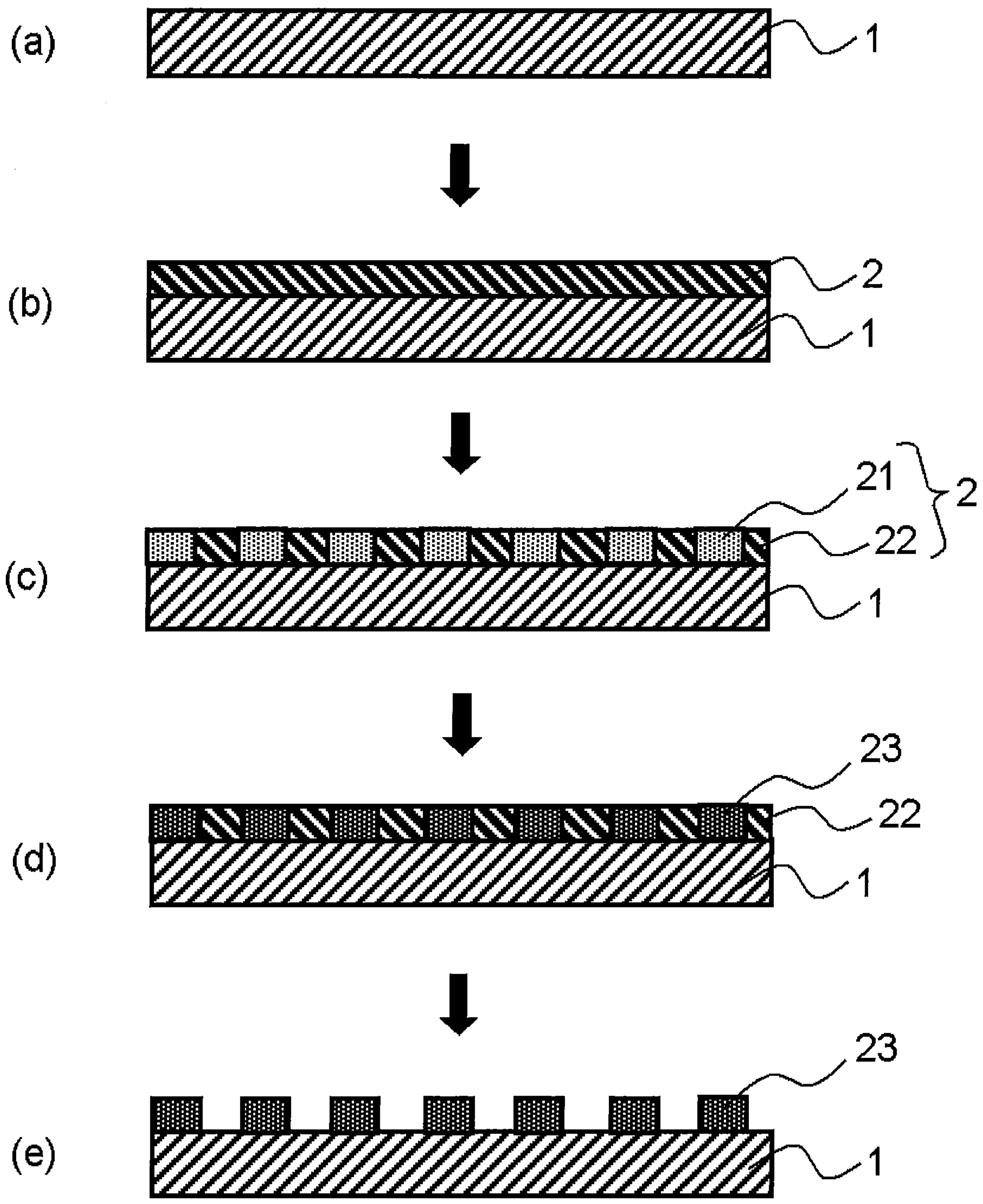
(a)
1
(b)
2
1
(c)
21
22
2
1
(d)
23
22
1
(e)
23
1

PATTERNING METHOD OF QUANTUM DOTS, METHOD FOR PRODUCING OPTICAL DEVICE, METHOD FOR MANUFACTURING BACKLIGHT UNIT, AND METHOD FOR MANUFACTURING IMAGE DISPLAY DEVICE

TECHNICAL FIELD

The present invention relates to a patterning method of quantum dots, a method for producing an optical device, a method for manufacturing a backlight unit, and a method for manufacturing an image display device.

BACKGROUND ART

Semiconductor crystal particles with nanosized particle diameters are called quantum dots, and excitons generated upon light absorption are confined in nanosized region, so that energy level of the semiconductor crystal particles becomes discrete and band gap thereof changes depending on the particle diameter. Owing to these effects, fluorescence emission by the quantum dots is brighter and more efficient than those by common fluorescent materials and light emission distribution thereof is sharp.

Moreover, based on such characteristics that the band gap varies depending on the particle diameter, the quantum dots are characterized in that the light emission wavelength is controllable and the quantum dots are expected to be applied as a wavelength conversion material for solid-state lighting and displays. For example, by using the quantum dots as the wavelength conversion material for a display, it is possible to realize a wider color range and lower power consumption than conventional fluorescent materials.

As a mounting method in which the quantum dots are used as wavelength conversion materials, a method of dispersing the quantum dots in a resin material and laminating the resin material containing the quantum dots with a transparent film to incorporate those into a backlight unit as a wavelength conversion film has been proposed (Patent Document 1).

In addition, it has been proposed that the quantum dots is used as a color filter material to absorb blue monochromatic light from a backlight unit so as to emit red or green light and thereby to function as the color filter and a wavelength conversion material; thus, applied to picture devices with high efficiency and excellent color reproducibility (Patent Document 2).

There is also a method of combining fluorescent layers containing the quantum dots with blue LED devices in LED chips being used for displays and solid-state lighting (Patent Document 3).

The use of quantum dots as a wavelength conversion material in micro-LED displays, in which tiny LED devices are used to form an LED array on a substrate, and the array is used for a backlight unit in a display, has been proposed (Patent Document 4).

CITATION LIST

Patent Literature

Patent Document 1: JP 2013-544018 A
Patent Document 2: JP 2017-21322 A
Patent Document 3: JP 2002-510866 A
Patent Document 4: JP 2020-516015 A Patent Document 5: WO 2018-225782 A1
Patent Document 6: JP 2021-12383 A

SUMMARY OF INVENTION

Technical Problem

To use quantum dots as a color filter, it is necessary to form patterns of two or three colors of red, green, and blue on a substrate. For example, when ultraviolet LEDs are used as a light source, a backlight unit having three colors, RGB, can be obtained by patterning the quantum dots on the substrate to form sub-pixels, in which the quantum dots absorb ultraviolet light from the light source to emit red, blue, and green, respectively. On the other hand, when blue LEDs are used as the light source, the backlight unit having three colors, RGB, can be obtained by patterning the quantum dots on the substrate to form the sub-pixels, in which the quantum dots absorb blue light from the light source to emit red and green, respectively, in which blue is transmitted unchanged from the light source.

As pattern-forming methods of the quantum dots, for example, photolithography using photoresist and an inkjet method, have been used (Patent Documents 5 and 6).

In patterning by photolithography, patterns are formed through a plurality of steps such as baking, exposing, and developing. In these steps, the degradation of the quantum dots is generated due to effects such as heat and light, resulting in a problem of deterioration of luminous efficacy.

In the patterning by inkjet, the quantum dot ink made of a resin solution containing the quantum dots is ejected directly from a nozzle onto a substrate to form the pattern, which can make steps fewer and minimize degradation of the quantum dots due to heat and light, thereby being expected as a useful method for a forming a quantum dot color filter. Moreover, the patterning by the inkjet ejects raw material onto only a necessary portion hence superior in utilization efficiency of the raw material and thus cost.

However, the inkjet ejects ink from a fine nozzle; thus, in order to form a fine patterning of 100 μm or less, which is required especially for applications such as micro-LEDs, the nozzle diameter becomes finer, resulting in significant limitations on ink characteristics to ensure stable ejection and pattern reproducibility. For example, the ink characteristics include viscosity of ink, evaporation rate of ink, concentration of the quantum dots in ink, agglomeration and sedimentation of the quantum dots in the resin solution, etc., and if these are not within an appropriate range for a device, these may be causes of problems such as clogging at the nozzle portion or ink supply line being likely to occur, and generation of changes and variations in ejection characteristics generated while continuous ejection causing characteristic unevenness between pixels. In particular, the piezo-based inkjet device has difficulty in ejection with an ink viscosity of 100 mPa-s or higher; thus, an ink with low viscosity is indispensable for a stable pattern formation. In general, an ink containing resin or particles often have viscosity of 100 mPa-s or higher, making it difficult to eject from the inkjet devices. Moreover, there are also problems such as pattern defects due to wettability of the ink on the substrates, and thickness unevenness of the pattern due to coffee-ring effect.

With these problems, the choice of solvents, resin materials, and the quantum dots concentration for the patterning by the inkjet is greatly restricted, and there is a problem in which the intended quantum dots pattern cannot be formed.

The present invention has been made to solve the above-described problem. An object of the present invention is to provide a patterning method of quantum dots in which an intended quantum dot pattern can be stably formed without the limitations due to the inkjet method and the degradation of the quantum dots can be suppressed; a method for producing an optical device including such patterning method of the quantum dots; a method for manufacturing a backlight unit including such patterning method of the quantum dots; and a method for manufacturing an image display device including such patterning method of the quantum dots.

Solution to Problem

To achieve the above problem, the present invention provides a patterning method of quantum dots, the method comprising the steps of: coating with a mixture containing quantum dots and a curable resin on a substrate to obtain a resin layer; ejecting a curing agent in a pattern shape on the resin layer by an inkjet method; performing a curing treatment to cure a portion of the resin layer where the curing agent was ejected; and removing an uncured portion of the resin layer with a solvent.

According to such inventive patterning method of quantum dots, it is possible to stably form a pattern of the quantum dots without being subject to limitations due to the inkjet method, such as limitations of ink solution in an inkjet step, and also to suppress degradation of the quantum dots.

A photocurable resin can be used as the curable resin.

The photocurable resin is preferred because the reaction thereof is easily controlled.

For example, at least one resin selected from the group consisting of epoxy resin, silicone resin, imide resin, acrylic resin, and vinyl resin can be used as the photocurable resin.

The photocurable resin to be used is not particularly limited, but resins mentioned above can be used, for example.

Alternatively, a thermosetting resin can be used as the curable resin.

The thermosetting resin is preferred because the reaction thereof is easily controlled.

For example, at least one resin selected from the group consisting of epoxy resin, silicone resin, urethane resin, acrylic resin, phenolic resin, melamine resin, and amino resin can be used as the thermosetting resin.

The thermosetting resin to be used is not particularly limited, but resins mentioned above can be used, for example.

Moreover, the present invention provides a method for producing an optical device, wherein a pattern of quantum dots is formed on a substrate by the inventive patterning method of quantum dots, thereby obtaining a wavelength conversion material having a function as a color filter.

According to the method for producing an optical device, it is possible to stably produce the optical device containing the quantum dots that are patterned to an intended pattern and have suppressed degradation.

In addition, the present invention provides a method for manufacturing a backlight unit, the method comprising the steps of: producing an optical device by the inventive method for producing an optical device; and fabricating a backlight unit being incorporated with a light source and the optical device.

According to the method for manufacturing a backlight unit, it is possible to stably manufacture the backlight unit containing the quantum dots that are patterned to an intended pattern and have suppressed degradation.

An LED array substrate having a plurality of micro-LED pixels can be used as the light source.

The light source to be used is not particularly limited, but the LED array substrate having a plurality of micro-LED pixels can be used, for example.

Furthermore, the present invention provides a method for manufacturing an image display device, the method comprising the steps of: manufacturing a backlight unit by the inventive method for manufacturing a backlight unit; and manufacturing an image display device unit being incorporated with the backlight unit.

According to the method for manufacturing an image display device, it is possible to stably manufacture the image display device with the backlight unit provided with the quantum dots that are patterned to an intended pattern and have suppressed degradation.

Advantageous Effects of Invention

As described above, according to the inventive patterning method of quantum dots, it is possible to stably form a pattern of quantum dots without being subject to limitations due to the inkjet method and to also suppress the degradation of quantum dots.

In addition, according to the inventive method for producing an optical device, it is possible to stably produce the optical device containing the quantum dots that are patterned to an intended pattern while suppressing degradation.

Moreover, according to the inventive method for manufacturing a backlight unit, it is possible to stably manufacture the backlight unit containing the quantum dots that are patterned to an intended pattern while suppressing degradation.

Furthermore, according to the inventive method for manufacturing an image display device, it is possible to stably manufacture the image display device containing the quantum dots that are patterned to an intended pattern while suppressing degradation.

BRIEF DESCRIPTION OF DRAWINGS

FIG. 1 is a schematic flow diagram illustrating an example of a patterning method of quantum dots according to the present invention.

DESCRIPTION OF EMBODIMENTS

As described above, a patterning of quantum dots by an inkjet method has a problem that has many limitations due to inkjet methods, such as quantum dot inks.

Based on that, the present inventors have earnestly studied to solve the problem. As a result, it is found that according to a patterning method to form the pattern of quantum dots by coating a mixture containing quantum dots and a curable resin on a substrate, ejecting a curing agent in a pattern shape by an inkjet method, and then curing a portion of the resin layer by a curing reaction, where the curing agent was ejected, and removing an uncured portion, it is possible to form the intended quantum dot pattern and also the suppression of degradation of quantum dots, without limitations due to the inkjet method such as limitation from ink solution. This finding has led to the completion of the present invention.

That is, the present invention is a patterning method of quantum dots, the method comprising the steps of:

coating with a mixture containing quantum dots and a curable resin on a substrate to obtain a resin layer;

ejecting a curing agent in a pattern shape on the resin layer by an inkjet method;

performing a curing treatment to cure a portion of the resin layer where the curing agent was ejected; and removing an uncured portion of the resin layer with a solvent.

In addition, the present invention is a method for producing an optical device, wherein a pattern of quantum dots is formed on a substrate by the inventive patterning method of quantum dots, thereby obtaining a wavelength conversion material having a function as a color filter.

Moreover, the present invention is a method for manufacturing a backlight unit, the method comprising the steps of:

producing an optical device by the inventive method for producing an optical; and fabricating a backlight unit being incorporated with a light source and the optical device.

Furthermore, the present invention is a method for manufacturing an image display device, the method comprising the steps of:

manufacturing a backlight unit by the inventive method for manufacturing a backlight; and manufacturing an image display device unit being incorporated with the backlight unit.

Hereinafter, the present invention will be described in detail; however, the present invention is not limited thereto.

[Patterning Method of Quantum Dots]

To begin with, referring to FIG. 1, an example of the inventive patterning method of quantum dots is described. However, FIG. 1 is a schematic diagram for description, and dimensions and patterns are not limited to those shown in FIG. 1.

First, as shown in FIG. 1 (*a*), a substrate 1 is provided on which the quantum dots are to be patterned thereon.

The substrate 1 is selectable according to a purpose. For example, a silicon wafer, a glass substrate, a resin plate, and a resin film are exemplified. Moreover, the substrate 1 may be surface-treated to improve adhesiveness of a pattern.

On the other hand, by mixing the quantum dots and a curable resin, a mixture containing the quantum dots and the curable resin is prepared. The quantum dots may be dispersed in the curable resin. In this step, by adding and mixing the quantum dots dispersed in a solvent to the curable resin, for example, the quantum dots can be dispersed in the curable resin. Alternatively, by adding and kneading the quantum dots, which are in a powder shape by removing the solvent, to the curable resin, the quantum dots can be dispersed in the curable resin. Alternatively, there is a method of polymerizing a monomer and an oligomer of the constituents of the curable resin under the coexistence of the quantum dots. Although some examples are given, the method of dispersing the quantum dots in the curable resin is not particularly limited and can be selected as appropriate according to the purpose.

In the present invention, a composition or a manufacturing method of quantum dots to be used is not particularly limited and the quantum dots according to the purpose can be selected. The quantum dots can have either a core-only or a core-shell structure, and the particle diameter can be selected as appropriate according to an intended wavelength range.

As the composition of the quantum dots, a group II-IV semiconductor, a group III-V semiconductor, a group II-VI semiconductor, a group I-III-VI semiconductor, a group II-IV-V semiconductor, a group IV semiconductor, a perovskite-type semiconductor, etc., are exemplified.

Specifically, the examples thereof include CdSe, CdS, CdTe, InP, InAs, InSb, AlP, AlAs, AlSb, ZnSe, ZnS, ZnTe, $Zn_3P_2$, GaP, GaAs, GaSb, $CuInSe_2$, $CuInS_2$, $CuInTe_2$, $CuGaSe_2$, $CuGaS_2$, $CuGaTe_2$, $CuAlSe_2$, $CuAlS_2$, $CuAlTe_2$, $AgInSe_2$, $AgInS_2$, AgInTe, $AgGaSe_2$, $AgGaS_2$, $AgGaTe_2$, PbSe, PbS, PbTe, GaN, AlN, AlGaN, Si, Ge, graphene, $CsPbCl_3$, $CsPbBr_3$, $CsPbI_3$, and $CH_3NH_3PbCl_3$, additionally, mixed crystal of these, and those having dopant added.

Moreover, the surfaces of the quantum dots may have the coating layer of organic molecules, inorganic molecules, or polymers, and the structure thereof is not limited and can be selected as appropriate.

As inorganic coating layers, the layers such as silicon oxide, zinc oxide, aluminum oxide, zirconium oxide, titanium oxide, and cerium oxide are exemplified.

As polymer coating layers, the layers such as polysilsesquioxane, poly (methylmethacrylate), polyacrylonitrile, polyethylene glycol, polyvinyl alcohol, and polyvinylpyrrolidone are exemplified.

Moreover, the quantum dots may be spherical, or cubic or rod-shaped. The shape of the quantum dots is not limited and can be freely selected.

It is preferred that an average particle diameter of the quantum dots is 20 nm or less. When the average particle diameter is 20 nm or less, a quantum size effect can be sufficiently obtained, and a high luminous efficacy can be realized; thus, a band gap owing to the particle diameter can be sufficiently controlled.

The particle diameter of the quantum dot can be calculated from an average value of maximum diameters in a predetermined direction, that is, Feret diameter, of 20 or more particles, by measuring a particle image obtained by a transmission electron microscope (TEM). Of course, the method of measuring the average particle diameter is not limited to this, and other methods can be used for the measurement.

The curable resin is not particularly limited and can be selected as appropriate according to purposes such as pattern size, curing speed, and resin characteristics after curing. The resin material may be the monomer or the oligomer or may contain a cross-linking agent. The resin material may be one type or may contain two or more types.

As curable resin, thermosetting resin and photocurable resin are preferred because the reaction thereof are easier to be controlled. Epoxy resin, silicone resin, imide resin, acrylic resin, vinyl resin, etc., are exemplified as photocurable resin. Moreover, epoxy resin, silicone resin, urethane resin, acrylic resin, phenolic resin, melamine resin, amino resin, amide resin, etc., are exemplified as thermosetting resin.

A concentration of quantum dots and solid content concentration in the mixture containing the quantum dots and the curable resin can be selected as appropriate. A solvent and a dispersant may be added as necessary.

The solvent is not particularly limited as long as compatibility with the quantum dots and the resin material is ensured.

For example, toluene, hexane, ethyl acetate, propylene glycol monomethyl ether, propylene glycol monomethyl ether acetate, etc., can be used as the solvent.

Viscosity of the mixture containing the quantum dots and the curable resin is not particularly limited but can be selected as appropriate according to purposes such as the resin material and the solid content concentration.

The mixture containing the quantum dots and the curable resin may also contain a scatter. By adding the scatter, an excitation light is scattered so that an excitation light absorption probability of the quantum dots in a color filter is increased; thus, an excitation light conversion efficiency can be increased.

The scatter can be selected from inorganic particles, organic particles, etc., as appropriate according to the purpose, and it is desired that the particle diameter or an additive amount is adjusted based on a wavelength or an emission wavelength of a light source to be used, or a structure of a wavelength conversion material, so as to optimize light extraction efficiency. Silica, zirconia, alumina, barium titanate, barium sulfate, etc., can be exemplified as inorganic particles. PMMA, polystyrene, polycarbonate, etc., can be exemplified as organic particles.

In addition, the mixture containing the quantum dots and the curable resin may also contain a sensitizer, and the type and an additive amount of the sensitizer can be selected as appropriate according to the resin material and the pattern shape. For example, an anthracene derivative, an anthraquinone derivative, a benzophenone derivative, etc., can be exemplified as a photosensitizer.

Next, the mixture containing the quantum dots and the curable resin is coated on the substrate 1, thereby obtaining a resin layer 2, as shown in FIG. 1 (*b*).

The coating of the mixture containing the quantum dots and the curable resin onto the substrate 1 can be performed, for example, by using a spray coater, a spin coater, a bar coater, or a doctor blade method. The resin layer 2 can be formed by such a coating.

A thickness of the resin layer 2 is not particularly limited and can be selected as appropriate according to use thereof. Moreover, the thinning of the resin layer 2 leads to a thickness decrease in a device; therefore, the resin layer thickness is preferably 50 μm or less, and particularly preferably 20 μm or less.

Next, a curing agent is ejected in a pattern shape onto the resin layer 2 by an inkjet method.

The curing agent can be ejected as a solution, for example, and in this case, the solution of the curing agent is prepared, and then the curing agent is ejected (coated) in the pattern shape onto the resin layer 2 on the substrate 1 by the inkjet device. The solvent to be used for preparing the curing agent solution is not particularly limited as long as the curing agent can be dissolved.

The curing agent solution may be dropped one droplet onto each of the pattern portions or may be dropped multiple times.

The curing agent can be selected as appropriate according to the type of curable resin. The curing agents mainly include a radical curing agent, a cationic curing agent, and an anionic curing agent, and it is desirable to use the curing agent suitable for the curing conditions of the curable resin.

As the radical curing agent, for example, a benzophenone derivative, an acetophenone derivative, a benzoin ether derivative, a thioxanthone derivative, an azo compound, a peroxide, etc., can be mentioned. As the cationic curing agent, for example, a sulfonium salt, an iodonium salt, etc., can be mentioned. As the anionic curing agent, an alkali metal, an alkyl lithium, etc., can be mentioned.

The curing agent solution ejected in the pattern shape can partially permeate into the resin layer 2. Accordingly, portion 21 of the resin layer 2, where the curing agent was ejected, is formed in the pattern shape, as shown in FIG. 1 (*c*). Reference sign 22 refers to a portion where the curing agent is not ejected.

After ejecting the curing agent, the portion 21 of the resin layer 2, where the curing agent was ejected, is cured. Only the portion 21 of the resin layer 2, where the curing agent was ejected, can be cured by UV light irradiation if it is a photocurable resin or by heating the entire substrate 1 if it is a thermosetting resin. In the case of thermosetting resin, the curing agent can also be thermally diffused into the portion 21 of the resin layer 2 during heating. It is preferred that the curing conditions are adjusted according to the resin material and the pattern shape.

Meanwhile, a portion 22, where the curing agent was not ejected, is included in the resin layer 2 as an uncured portion.

After performing the curing treatment, the uncured portion of the resin layer 2 is removed by the solvent. Accordingly, as shown in FIG. 1 (*e*), a pattern 23 of the cured resin layer containing the quantum dots can be formed on the substrate 1.

The method for removing the uncured portion by the solvent can be selected as appropriate according to the resin characteristics or the pattern shape. For example, the methods include removal by a spray or immersion of the substrate 1 into the solvent.

According to the inventive patterning method described above, the pattern formation of the quantum dots by the inkjet method can be stably performed without limitations due to the inkjet method, such as the resin material or a quantum dot concentration. Moreover, according to the inventive patterning method, degradation of the quantum dots can be suppressed because the effects of heat and light on the quantum dots are smaller than those of the patterning method by photolithography. Consequently, according to the inventive patterning method, the degradation of the quantum dots can be suppressed, thereby stably forming the intended quantum dots pattern.

[Method for Producing Optical Device]

An inventive method for producing an optical device is characterized in that a pattern of quantum dots is formed on a substrate by the inventive patterning method of the quantum dots, thereby obtaining a wavelength conversion material having a function as a color filter.

According to the inventive method for producing the optical device, patterning of the quantum dots can be stably performed, and degradation of the quantum dots can be suppressed by the inventive patterning method of the quantum dots. Therefore, it is possible to stably obtain a quantum dots color filter (wavelength conversion material) having the intended quantum dots pattern and suppressing degradation of the quantum dots.

The optical device produced by the present invention includes the wavelength conversion material having a function as the color filter, but may further include other components. In addition, in the inventive method for producing an optical device, a step other than forming the pattern of quantum dots on a substrate to obtain the wavelength conversion material having the function as the color filter by the inventive patterning method of quantum dots is not particularly limited and can be selected as appropriate according to the purpose.

[Method for Manufacturing Backlight Unit]

An inventive method for manufacturing a backlight unit includes the steps of producing an optical device by the inventive method for producing the optical device, and fabricating a backlight unit being incorporated with a light source and the optical device.

According to the inventive method for manufacturing the backlight unit, because a step to manufacture the optical device by the inventive method for producing the optical device is included; thus, the backlight unit containing the quantum dots patterned in an intended pattern and with suppressed degradation can be stably manufactured.

As the light source, although not limited, an LED array substrate having a plurality of micro-LED pixels, for example, can be used.

The black light unit manufactured in the present invention can further include components other than the optical device and the light source according to purpose.

[Method for Manufacturing Image Display Device]

An inventive method for manufacturing an image display device includes the steps of manufacturing a backlight unit by the inventive method for manufacturing a backlight unit, and manufacturing an image display device unit being incorporated with the backlight unit.

According to the inventive method for manufacturing the image display device, the step to manufacture the backlight unit by the inventive method for manufacturing the backlight unit is included; thus, the image display device, in which the backlight unit includes the quantum dots patterned in an intended pattern and with suppressed degradation, can be stably manufactured.

EXAMPLES

Hereinafter, the present invention will be specifically described with reference to Examples and Comparative Examples. However, the present invention is not limited thereto.

In Examples and Comparative Examples described below, core-shell type quantum dots of InP/ZnSe/ZnS were used as quantum dot materials. In the fluorescence emission property evaluation of the quantum dots (quantum dot-containing polymers) obtained through the surface treatment, by using the quantum efficiency measurement system (QE-2100) manufactured by Otsuka Electronics Co., Ltd., the emission wavelength, half width of fluorescence emission, and fluorescence emission efficiency (internal quantum efficiency) of the quantum dots at an excitation wavelength of 450 nm were measured.

(Step of Synthesis of Core of Quantum Dot)

0.23 g (0.9 mmol) of palmitic acid, 0.088 g (0.3 mmol) of indium acetate, and 10 mL of 1-octadecene were added into a flask, heated and stirred at 100° C. under reduced pressure, and degassed for 1 hour while dissolving the raw materials. Thereafter, nitrogen was purged into the flask, and 0.75 mL (0.15 mmol) of a solution prepared by mixing tristrimethylsilylphosphine with trioctylphosphine and adjusted to 0.2 M was added, followed by raising the temperature to 300° C., then it was confirmed that the solution has changed from yellow to red and core particles were generated.

(Step of Synthesis of Shell Layer of Quantum Dot)

Next, 2.85 g (4.5 mmol) of zinc stearate and 15 mL of 1-octadecene were added to another flask, heated to 100° C. and stirred under reduced pressure, and degassed for 1 hour while being dissolved to prepare 0.3 M of octadecene zinc stearate solution, then 3.0 mL (0.9 mmol) of the solution was added to the reaction solution after the core synthesis and cooled to 200° C. Next, 0.474 g (6 mmol) of selenium and 4 mL of trioctylphosphine were added to another flask and dissolved by heating to 150° C. to prepare 1.5 M of selenium trioctylphosphine solution, then while the temperature of the reaction solution after the core synthesis step which had been cooled to 200° C. was raised to 320° C. over 30 minutes, a total of 0.6 mL (0.9 mmol) of the selenium trioctylphosphine solution was added in increments of 0.1 mL and held at 320° C. for 10 minutes, followed by cooling to room temperature. 0.44 g (2.2 mmol) of zinc acetate was added thereto and dissolved by heating to 100° C. and stirring under reduced pressure. The inside of the flask was purged with nitrogen again, then the temperature was raised to 230° C., and 0.98 mL (4 mmol) of 1-dodecanethiol was added and held for 1 hour. The resultant solution was cooled to room temperature to prepare a core-shell type quantum dot-containing solution made of InP/ZnSe/ZnS.

When the emission wavelength, half width of fluorescence emission, and fluorescence emission efficiency (internal quantum efficiency) of these quantum dots were measured; the emission wavelength was 533 nm, the half width was 40 nm, and the internal quantum efficiency was 79%.

Example 1

Quantum dots synthesized by the above procedure and methacrylic-modified silicone oil X-32-3817-3 (Shin-Etsu Chemical Co., Ltd.) as a photocurable resin were added and mixed so as to be 30 parts by mass of the quantum dots relative to 100 parts by mass of the silicone oil. The viscosity of this mixture was measured by a rotational viscometer (Brookfield DV-I), and it was 2166 mPa·s at 25° C.

This mixture was coated on a glass substrate using a spin coater (ACTIVE Co., Ltd. ACT-220AII) so as to make a resin layer having a thickness of 10 μm. After coating, the entire substrate was heated to 120° C. on a hot plate to remove excess solvent.

As a photocuring agent, the agent in which Irgacure 1173 (IGM Resins B.V.) was diluted 10-fold with propylene glycol monomethyl ether acetate solvent was provided. This photocuring agent was ejected onto the resin layer in a 200 μm pitch pattern shape by an inkjet device (MICROJET Corporation, LaboJet-600Bio).

The substrate, after being subjected to ejection with the photocuring agent, was irradiated with light having 365 nm wavelength and 500 mW/cm$^2$ output under a nitrogen atmosphere to cure a portion of the resin layer where the curing agent was ejected. The substrate was then immersed in toluene and subjected to ultrasonic cleaning to remove an uncured portion of the resin layer.

The pattern of the quantum dots remaining on the substrate (the pattern on the resin layer containing the quantum dots) was measured with a laser microscope (Olympus Corporation, OLS-4100), and it was confirmed that a dot-shape pattern having an average thickness of 5 μm and a pattern size of 50 μm was formed.

Example 2

Quantum dots synthesized by the above procedure and a bisphenol A type epoxy resin EPICLON 850 (DIC Corporation) as a thermosetting resin were added and mixed so as to be 30 parts by mass of the quantum dots relative to 100 parts by mass of epoxy resin. The viscosity of this mixture was measured by a rotational viscometer, and it was 1124 mPa-s at 25° C.

This mixture was coated on a glass substrate using a spin coater so as to make a resin layer having a thickness of 10 μm. After coating, the entire substrate was heated to 120° C. on a hot plate to remove excess solvent.

As a thermosetting agent, the agent in which a polyamidеamine curing agent EPICLONB-065 (DIC Corporation) was diluted 10-fold with propylene glycol monomethyl ether solvent was provided. This thermosetting agent was ejected onto the resin layer in a 200 μm pitch pattern shape by an inkjet device.

The substrate, after being subjected to ejection with the thermosetting agent, was heated on a hot plate of 150° C. for 60 minutes to cure a portion of the resin layer, where the curing agent was ejected. The substrate was then immersed in toluene and subjected to ultrasonic cleaning to remove an uncured portion of the resin layer.

The pattern of the quantum dots remaining on the substrate was measured with a laser microscope, and it was confirmed that a dot-shape pattern having an average thickness of 6 μm and a pattern size of 60 μm was formed.

Comparative Example 1

Quantum dots synthesized by the above procedure and methacrylic-modified silicone oil X-32-3817-3 were added so as to be 30 parts by mass of the quantum dots relative to 100 parts by mass of the silicone oil. Moreover, Irgacure 1173 (IGM Resins B.V.) was added and mixed so as to be 2 parts by mass of Irgacure 1173 relative to 100 parts by mass of the silicone oil. The viscosity of this mixture was measured by a rotational viscometer, and it was 955 mPa-s at 25° C.

This mixture was directly ejected onto a substrate by an inkjet device, but a nozzle was clogged in the middle of process, and thus the process failed to be performed.

Comparative Example 2

Quantum dots synthesized by the above procedure and methacrylic-modified silicone oil X-32-3817-3 were added so as to be 30 parts by mass of the quantum dots relative to 100 parts by mass of the silicone oil. Moreover, Irgacure 1173 (IGM Resins B.V.) was added and mixed so as to be 2 parts by mass of Irgacure 1173 relative to 100 parts by mass of the silicone oil. Furthermore, propylene glycol monomethyl ether acetate was added to this mixture and performed 20-fold dilution. The viscosity of this mixture was measured by a rotational viscometer, and it was 106 mPa-s at 25° C.

This mixture was directly ejected onto a substrate at a pitch of 200 μm by an inkjet device, and after the ejection, the substrate was heated to 150° C. on a hot plate to remove solvent.

Next, the substrate was irradiated with light having 365 nm wavelength and 500 mW/cm$^2$ output under a nitrogen atmosphere to perform curing. The substrate was then immersed in toluene and subjected to ultrasonic cleaning to remove an uncured portion.

The pattern of the quantum dots remaining on the substrate was measured by a laser microscope, and it was confirmed that a dot-shape pattern having an average thickness of 5 μm at the periphery portion and 1 μm at the center portion with a concave shape and a pattern size that varied from 50 to 80 μm were formed. That is, in Comparative Example 2, the intended quantum dots pattern failed to be stably formed.

As described above, the quantum dot pattern can be stably formed regardless of quantum dot concentration or resin materials owing to processing by the inventive patterning method including the steps of coating with the mixture containing the quantum dots and a curable resin on the substrate to obtain a resin layer, ejecting a curing agent in a pattern shape on the resin layer by an inkjet method, performing a curing treatment to cure the portion of the resin layer where the curing agent was ejected, and removing an uncured portion of the resin layer with a solvent. Moreover, according to the inventive patterning method, degradation of the quantum dots can be suppressed because the effects of heat and light on the quantum dots are smaller than those of the patterning method by photolithography. Furthermore, by repeatedly forming quantum dot patterns emitting lights of green, red, and blue using the patterning method described above, the quantum dot pattern of RGB can be obtained.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A patterning method of quantum dots, the method comprising the steps of:

coating with a mixture containing quantum dots and a curable resin on a substrate to obtain a resin layer;

ejecting a curing agent in a pattern shape on the resin layer by an inkjet method;

performing a curing treatment to cure a portion of the resin layer where the curing agent was ejected; and removing an uncured portion of the resin layer with a solvent.

2. The patterning method of quantum dots according to claim 1, wherein a photocurable resin is used as the curable resin.

3. The patterning method of quantum dots according to claim 2, wherein at least one resin selected from the group consisting of epoxy resin, silicone resin, imide resin, acrylic resin, and vinyl resin is used as the photocurable resin.

4. The patterning method of quantum dots according to claim 1, wherein a thermosetting resin is used as the curable resin.

5. The patterning method of quantum dots according to claim 4, wherein at least one resin selected from the group consisting of epoxy resin, silicone resin, urethane resin, acrylic resin, phenolic resin, melamine resin, and amino resin is used as the thermosetting resin.

6. A method for producing an optical device, wherein a pattern of quantum dots is formed on a substrate by the patterning method of quantum dots according to claim 1, thereby obtaining a wavelength conversion material having a function as a color filter.

7. A method for producing an optical device, wherein a pattern of quantum dots is formed on a substrate by the patterning method of quantum dots according to claim 2, thereby obtaining a wavelength conversion material having a function as a color filter.

8. A method for producing an optical device, wherein a pattern of quantum dots is formed on a substrate by the patterning method of quantum dots according to claim 3, thereby obtaining a wavelength conversion material having a function as a color filter.

9. A method for producing an optical device, wherein a pattern of quantum dots is formed on a substrate by the patterning method of quantum dots according to claim 4, thereby obtaining a wavelength conversion material having a function as a color filter.

10. A method for producing an optical device, wherein a pattern of quantum dots is formed on a substrate by the patterning method of quantum dots according to claim 5, thereby obtaining a wavelength conversion material having a function as a color filter.

11. A method for manufacturing a backlight unit, the method comprising the steps of:

producing an optical device by the method for producing an optical device according to claim 6; and fabricating a backlight unit being incorporated with a light source and the optical device.

12. A method for manufacturing a backlight unit, the method comprising the steps of:

producing an optical device by the method for producing an optical device according to claim 7; and fabricating a backlight unit being incorporated with a light source and the optical device.

13. A method for manufacturing a backlight unit, the method comprising the steps of:

producing an optical device by the method for producing an optical device according to claim 8; and fabricating a backlight unit being incorporated with a light source and the optical device.

14. A method for manufacturing a backlight unit, the method comprising the steps of:

producing an optical device by the method for producing an optical device according to claim 9; and fabricating a backlight unit being incorporated with a light source and the optical device.

15. A method for manufacturing a backlight unit, the method comprising the steps of:

producing an optical device by the method for producing an optical device according to claim 10; and fabricating a backlight unit being incorporated with a light source and the optical device.

16. The method for manufacturing a backlight unit according to claim 11, wherein an LED array substrate having a plurality of micro-LED pixels is used as the light source.

17. A method for manufacturing an image display device, the method comprising the steps of:

manufacturing a backlight unit by the method for manufacturing a backlight unit according to claim 11; and manufacturing an image display device unit being incorporated with the backlight unit.

* * * * *